(12) United States Patent
Ito et al.

(10) Patent No.: US 9,941,576 B2
(45) Date of Patent: Apr. 10, 2018

(54) ANTENNA DEVICE AND ELECTRONIC DEVICE

(71) Applicant: Murata Manufacturing Co., Ltd., Nagaokakyo-shi, Kyoto-fu (JP)

(72) Inventors: Hiromitsu Ito, Nagaokakyo (JP); Masahiro Ozawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/268,680

(22) Filed: Sep. 19, 2016

(65) Prior Publication Data

US 2017/0005399 A1    Jan. 5, 2017

Related U.S. Application Data

(63) Continuation of application No. PCT/JP2015/059305, filed on Mar. 26, 2015.

(30) Foreign Application Priority Data

Mar. 28, 2014 (JP) ................................. 2014-068476

(51) Int. Cl.
    *H01Q 1/24*    (2006.01)
    *H02J 50/12*   (2016.01)
    (Continued)

(52) U.S. Cl.
    CPC ......... *H01Q 1/243* (2013.01); *G06K 7/10168* (2013.01); *H01Q 1/36* (2013.01); *H01Q 1/38* (2013.01); *H01Q 7/06* (2013.01); *H01Q 21/28* (2013.01); *H02J 7/025* (2013.01); *H02J 50/10* (2016.02); *H02J 50/12* (2016.02); *H02J 50/40* (2016.02); *H02J 50/70* (2016.02); *H04B 5/0031* (2013.01); *H04B 5/0037* (2013.01);
    (Continued)

(58) Field of Classification Search
    None
    See application file for complete search history.

(56) References Cited

U.S. PATENT DOCUMENTS 8,237,622 B2 *   8/2012   Furumura ........ G06K 19/07749
                                                      343/795
2007/0051807 A1  3/2007   Yamaguchi
(Continued)

FOREIGN PATENT DOCUMENTS

JP            4325621 B2      9/2009
JP        2012-019302 A       1/2012
(Continued)

OTHER PUBLICATIONS

English translation of Official Communication issued in corresponding International Application PCT/JP2015/059305, dated Jun. 23, 2015.

*Primary Examiner* — Trinh Dinh
(74) *Attorney, Agent, or Firm* — Keating & Bennett, LLP

(57) ABSTRACT

An antenna device includes a power supply coil to which a near field communication circuit is connected, a near field communication coil that is coupled to an antenna coil of a communication target and the power supply coil via a magnetic field and that resonates at the frequency of a near field communication signal, and a non-contact charging coil that is connected to a non-contact charging control circuit and that is coupled to a target coil for non-contact charging. The power supply coil and the non-contact charging coil are provided on the same plane or on planes that are close to each other. The non-contact charging coil is superposed with the near field communication coil when viewed in plan view, and the shortest distance between the power supply coil and the NFC coil is smaller than the shortest distance between the power supply coil and the non-contact charging coil.

19 Claims, 18 Drawing Sheets

(51) Int. Cl.
*H02J 50/40* (2016.01)
*H02J 50/70* (2016.01)
*H01Q 7/06* (2006.01)
*H04B 5/00* (2006.01)
*H01Q 1/38* (2006.01)
*H01Q 21/28* (2006.01)
*G06K 7/10* (2006.01)
*H02J 7/02* (2016.01)
*H05K 1/16* (2006.01)
*H02J 50/10* (2016.01)
*H01Q 1/36* (2006.01)

(52) U.S. Cl.
CPC ........... *H04B 5/0081* (2013.01); *H05K 1/165* (2013.01)

(56) References Cited

U.S. PATENT DOCUMENTS

| | | |
|---|---|---|
| 2012/0248883 A1 | 10/2012 | Konanur et al. |
| 2014/0168019 A1 | 6/2014 | Hirobe et al. |
| 2014/0198011 A1 | 7/2014 | Tsubaki et al. |
| 2014/0306656 A1 | 10/2014 | Tabata et al. |
| 2014/0375262 A1 | 12/2014 | Yamaguchi et al. |
| 2015/0326055 A1 | 11/2015 | Koyanagi et al. |
| 2016/0118711 A1* | 4/2016 | Finn ................. G06K 19/07773 343/867 |
| 2016/0211702 A1* | 7/2016 | Muratov ................. H01F 38/14 |
| 2017/0093017 A1* | 3/2017 | Yosui ................... H01Q 1/2283 |

FOREIGN PATENT DOCUMENTS

| | | |
|---|---|---|
| JP | 2013-021902 A | 1/2013 |
| JP | 2013-093429 A | 5/2013 |
| JP | 2013-120932 A | 6/2013 |
| JP | 2013-121248 A | 6/2013 |
| JP | 2013-128093 A | 6/2013 |
| JP | 2013-169122 A | 8/2013 |
| JP | 2014-011851 A | 1/2014 |
| WO | 2012/135211 A2 | 10/2012 |
| WO | 2013/157191 A1 | 10/2013 |
| WO | 2013/179866 A1 | 12/2013 |

* cited by examiner

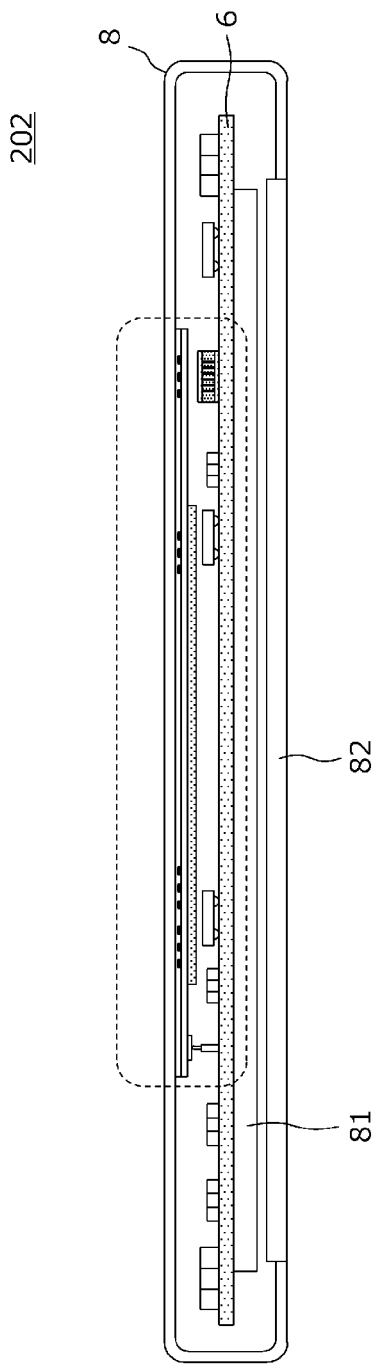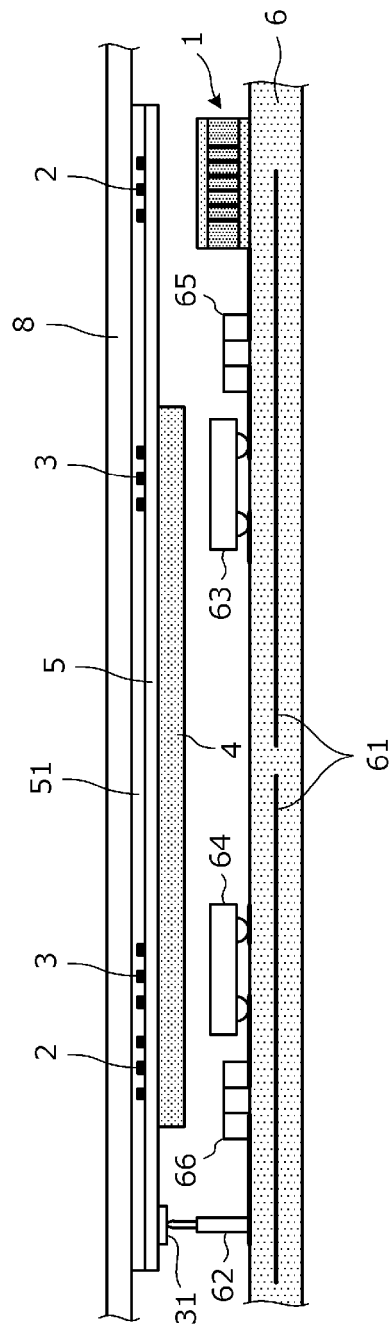

ANTENNA DEVICE AND ELECTRONIC DEVICE

CROSS REFERENCE TO RELATED APPLICATIONS

This application claims the benefit of priority to Japanese Patent Application 2014-068476 filed Mar. 28, 2014 and is a Continuation Application of PCT/JP2015/059305 filed on Mar. 26, 2015. The entire contents of each of these applications are hereby incorporated herein by reference.

BACKGROUND OF THE INVENTION

1. Field of the Invention

The present invention relates to an antenna device that includes a plurality of coils for different systems, such as a non-contact charging coil and a near field communication coil, and an electronic device that includes the antenna device.

2. Description of the Related Art

A module that includes a communication device, such as a mobile terminal, equipped with a near field communication (NFC) coil, which uses radio waves of an HF (13.56 MHz) band, and with a non-contact charging coil is disclosed in Japanese Unexamined Patent Application Publication No. 2013-121248 and Japanese Unexamined Patent Application Publication No. 2013-169122.

In the module disclosed in Japanese Unexamined Patent Application Publication No. 2013-121248, the non-contact charging coil and the NFC coil, each of which has a rectangular spiral shape, are superposed with each other so as to be concentric with each other.

In the module disclosed in Japanese Unexamined Patent Application Publication No. 2013-169122, the non-contact charging coil and the NFC coil are arranged so that the axes of the coils are perpendicular to each other.

In the module disclosed in Japanese Unexamined Patent Application Publication No. 2013-121248, since the non-contact charging coil and the NFC coil are coaxial with each other, and their coil conductors are arranged so as to be close to each other, there is a concern that a non-contact charging circuit and an NFC circuit may interfere with each other due to coupling of the coils.

In the module disclosed in Japanese Unexamined Patent Application Publication No. 2013-169122, since the non-contact charging coil and the NFC coil are arranged so that the axes of the coils are perpendicular to each other, the coils are less likely to be coupled to each other. Thus, it is less likely that interference between a non-contact charging circuit and an NFC circuit will occur. However, there is a limitation on the shape of the NFC coil and on how the NFC coil is wound, and there are problems in that the size (height) of the NFC coil is likely to increase, and in that the degree of freedom when designing the NFC coil is small.

SUMMARY OF THE INVENTION

Preferred embodiments of the present invention provide an antenna device that is capable of being used in a plurality of different wireless transmission systems, such as non-contact charging and near field communication, and that significantly reduces or prevents mutual interference between the plurality of different wireless transmission systems without increasing the size of the antenna device, and an electronic device that includes the antenna device.

An antenna device according to a preferred embodiment of the present invention includes a power supply coil to which a first wireless transmission system circuit is connected, a first wireless transmission system coil that is coupled to an antenna coil of a transmission target in the first wireless transmission system and to the power supply coil via a magnetic field and that resonates at a transmission frequency of the first wireless transmission system, and a second wireless transmission system coil that is connected to the second wireless transmission system circuit and that is coupled to an antenna coil of a transmission target in the second wireless transmission system via a magnetic field. At least a portion of a coil opening of the second wireless transmission system coil and at least a portion of a coil opening of the first wireless transmission system coil are superposed with each other when viewed in plan. The first wireless transmission system coil includes a coupling portion that is coupled to the power supply coil via a magnetic field, and the shortest distance between the coupling portion of the first wireless transmission system coil and the power supply coil is smaller than the shortest distance between the power supply coil and the second wireless transmission system coil.

With the above-described configuration, the second wireless transmission system coil and the power supply coil are arranged so as not to be coupled to each other, whereas the second wireless transmission system coil and the first wireless transmission system coil may be coupled to each other. Thus, mutual interference between the second wireless transmission system and the first wireless transmission system is effectively reduced or prevented.

An antenna device according to a preferred embodiment of the present invention preferably further includes a magnetic sheet that is superposed with the second wireless transmission system coil when viewed in plan view. With this configuration, the second wireless transmission system coil and a different conductive portion are prevented, by the magnetic sheet, from unnecessarily being in a magnetic field coupling relationship with each other, and the generation of an eddy current in the conductive portion is effectively reduced or prevented.

In an antenna device according to a preferred embodiment of the present invention, preferably, the magnetic sheet is positioned in a vicinity of the first wireless transmission system coil, and at least a portion of the first wireless transmission system coil is located out of a vicinity range of the magnetic sheet. In addition, the power supply coil is preferably disposed at a position where the power supply coil is in a magnetic field coupling relationship with the coupling portion of the first wireless transmission system coil, the position being located out of the vicinity range of the magnetic sheet. With this configuration, the first wireless transmission system coil and a different conductive portion are prevented, by the magnetic sheet, from unnecessarily being in a magnetic field coupling relationship with each other, and the generation of an eddy current in the conductive portion is effectively reduced or prevented.

In an antenna device according to a preferred embodiment of the present invention, preferably, the power supply coil is disposed in an area outside of the second wireless transmission system coil when viewed in plan view. As a result, unnecessary coupling of the power supply coil and the second wireless transmission system coil is effectively reduced or prevented.

In an antenna device according to a preferred embodiment of the present invention, preferably, the power supply coil includes a magnetic core and a coil conductor that is wound around the magnetic core, and the power supply coil is disposed such that a coil winding axis of the coil conductor extends in the area outside the second wireless transmission system coil when viewed in plan view. As a result, unnecessary coupling of the power supply coil and the second wireless transmission system coil is more effectively reduced or prevented.

In an antenna device according to a preferred embodiment of the present invention, preferably, the power supply coil is disposed in an area inside the second wireless transmission system coil when viewed in plan view. With this configuration, the area occupied by the antenna device is significantly reduced.

In an antenna device according to a preferred embodiment of the present invention, preferably, the power supply coil is disposed at a position that is superposed with a coil winding axis of the second wireless transmission system coil when viewed in plan view. As a result, unnecessary coupling of the power supply coil and the second wireless transmission system coil is more effectively reduced or prevented.

In an antenna device according to a preferred embodiment of the present invention, preferably, the coupling portion of the first wireless transmission system coil is located on a rear side of the magnetic sheet as seen from the second wireless transmission system coil. With this configuration, unnecessary coupling of the power supply coil and the second wireless transmission system coil is more effectively reduced or prevented.

In an antenna device according to a preferred embodiment of the present invention, preferably, the antenna device further includes a magnetic sheet that is superposed with the second wireless transmission system coil and the first wireless transmission system coil when viewed in plan view, and the power supply coil is disposed in an area outside the second wireless transmission system coil when viewed in plan view. In addition, in a region that is superposed with the second wireless transmission system coil when viewed in plan view, the magnetic sheet is preferably positioned on a side opposite to a side on which a target coil for the second wireless transmission system is positioned with respect to the second wireless transmission system coil, and in the coupling portion of the first wireless transmission system coil, the magnetic sheet is preferably positioned on a side opposite to a side on which the power supply coil is positioned with respect to the first wireless transmission system coil. With this configuration, the degree of coupling of the power supply coil and the coil for the first wireless transmission system is increased. In addition, unnecessary coupling of the power supply coil and the second wireless transmission system coil is effectively reduced or prevented.

In an antenna device according to a preferred embodiment of the present invention, preferably, a conductive member or a magnetic member is disposed between the power supply coil and the second wireless transmission system coil. As a result, unnecessary coupling of the power supply coil and the second wireless transmission system coil is more effectively reduced or prevented.

In an antenna device according to a preferred embodiment of the present invention, preferably, the first wireless transmission system coil and the second wireless transmission system coil is provided on the same main surface of a substrate. With this configuration, the number of components is able to be reduced, and a reduction in the size of the antenna device and a reduction in the manufacturing costs of the antenna device are achieved.

In an antenna device according to a preferred embodiment of the present invention, preferably, the substrate is bent in the area outside the second wireless transmission system coil, and as a result of the substrate being bent, the coupling portion of the first wireless transmission system coil is positioned on a side opposite to a side on which the surface, on which the coil for the second wireless transmission system is disposed, is positioned. With this configuration, the area occupied by the antenna device is reduced, and unnecessary coupling of the second wireless transmission system coil and the power supply coil is effectively reduced or prevented.

In an antenna device according to a preferred embodiment of the present invention, preferably, a transmission frequency band of the first wireless transmission system and a transmission frequency band of the second wireless transmission system are different from each other.

In an antenna device according to a preferred embodiment of the present invention, preferably, one of the first wireless transmission system and the second wireless transmission system is a near field communication system, and another one of the first wireless transmission system and the second wireless transmission system is a non-contact charging system.

An electronic device according to a preferred embodiment of the present invention includes an antenna device according to a preferred embodiment of the present invention, a secondary battery that is a power supply for a circuit including a circuit of the near field communication system, and a non-contact charging control circuit that charges the secondary battery by using electrical power induced by a coil for the non-contact charging system.

According to preferred embodiments of the present invention, by causing the first wireless transmission system coil to resonate at a frequency near 13.56 MHz, a signal of the second wireless transmission system having a different frequency (e.g., 1 MHz/7 MHz) is less likely to be transmitted to the power supply coil due to the selection effect of resonance. Since the power supply coil and the first wireless transmission system coil are not directly coupled (DC-connected) to each other and are coupled to each other via a magnetic field, and in addition, the second wireless transmission system coil and the power supply coil will rarely be coupled to each other whereas the first wireless transmission system coil and the second wireless transmission system coil are coupled to each other, interference between the second wireless transmission system and the first wireless transmission system is effectively reduced or prevented while ensuring a sufficient function of the first wireless transmission system. In addition, since the first wireless transmission system coil and the second wireless transmission system coil can be arranged so as to be close to each other, the degree of freedom when designing the first wireless transmission system coil is large.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5A is a cross-sectional view of an electronic device 202 in which the antenna device 102 is included, and FIG. 5B is a cross-sectional view of a portion of the electronic device 202 in which the antenna device 102 is included and that is surrounded by a dashed line illustrated in FIG. 5A.

DETAILED DESCRIPTION OF THE PREFERRED EMBODIMENTS

Figure 1A:
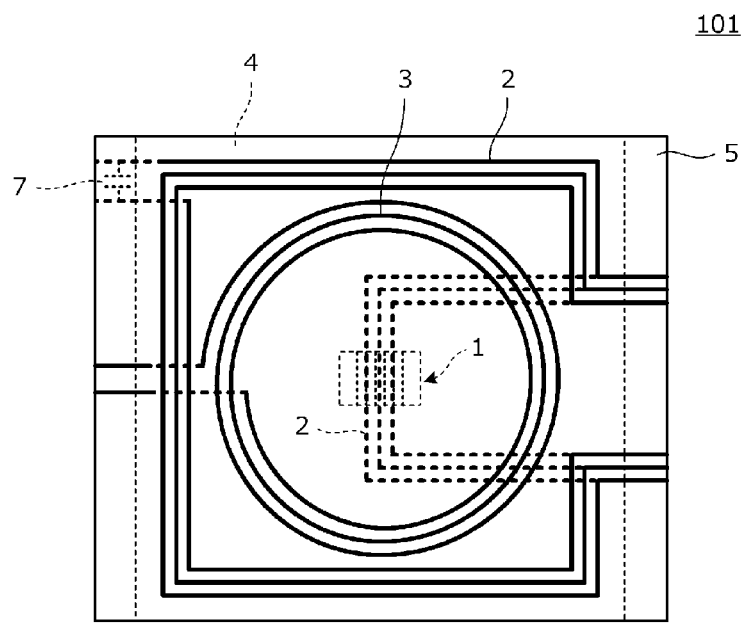
FIG. 1A is a plan view of an antenna device 101 according to a first preferred embodiment of the present invention.

A plurality of preferred embodiments of the present invention will be described below with reference to the drawings. The same members in the drawings are denoted by the same reference numerals. Each of the preferred embodiments is an example, and the configurations according to the different preferred embodiments may be partially replaced with one another or may be combined with each other. In a second preferred embodiment and the subsequent preferred embodiments, description of a configuration that is common to a first preferred embodiment will be omitted, and only the differences from the first preferred embodiment will be described. In particular, similar advantageous effects obtained in similar configurations will not be described in every preferred embodiment.

Preferred embodiments of the present invention relate to an antenna device that is capable of being used in a plurality of different wireless transmission systems and an electronic device that includes the antenna device. Among the plurality of wireless transmission systems, examples of combinations of first and second wireless transmission systems are as follows.

EXAMPLE 1

First Transmission System: near field communication system

Second Transmission System: wireless power transmission system

EXAMPLE 2

First Transmission System: wireless power transmission system

Second Transmission System: near field communication system

EXAMPLE 3

First Transmission System: first near field communication system

Second Transmission System: second near field communication system

In each of the following preferred embodiments, a case in which a first wireless transmission system and a second wireless transmission system are respectively a near field communication system and a wireless power transmission system will be described.

First Preferred Embodiment

Figure 1B:
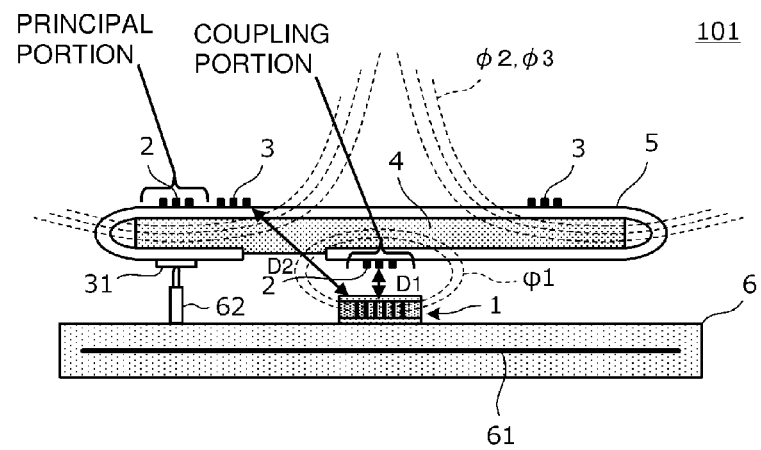
FIG. 1B is a cross-sectional view of the antenna device 101.

FIG. 1A is a plan view of an antenna device 101 according to the first preferred embodiment, and FIG. 1B is a cross-sectional view of the antenna device 101.

The antenna device 101 according to the present preferred embodiment includes a power supply coil 1, an NFC coil 2, a non-contact charging coil 3, and a magnetic sheet 4. The NFC coil 2 corresponds to a first wireless transmission system coil according to a preferred embodiment of the present invention. The NFC coil is, for example, a communication coil for use in NFC that uses a frequency band of about 13.56 MHz. The non-contact charging coil 3 corresponds to a second wireless transmission system coil according to preferred embodiments of the present invention. The non-contact charging coil 3 is, for example, a coil conforming to the Qi standard (Registered Trademark) developed by the Wireless Power Consortium (WPC) that uses a frequency band in the range of 110 kHz to 205 kHz or a coil conforming to the Rezence standard (Registered Trademark) developed by the Alliance for Wireless Power (A4WP) that uses a frequency band of about 6.78 MHz.

The power supply coil 1 is mounted on a printed wiring board 6. The NFC coil 2 and the non-contact charging coil 3 are disposed on a surface of a base material sheet 5. The base material sheet 5 is bent at two sides of the magnetic sheet 4 so as to surround or substantially surround the magnetic sheet 4. The base material sheet 5 is, for example, a PET resin sheet, an LCP resin sheet, or a polyimide sheet. The magnetic sheet 4 is, for example, formed by forming a mixture of a magnetic powder, such as a ferrite powder, and a resin material into the shape of a rectangular or substantially rectangular plate or by forming a sintered magnetic material, which has been cut into small pieces, into the shape of a rectangular or substantially rectangular plate.

A portion of the NFC coil 2 is bent so as to extend from a top surface of the magnetic sheet 4 to a bottom surface of the magnetic sheet 4 as a result of the base material sheet 5 being bent. A principal portion of the NFC coil 2 preferably includes a portion having a rectangular or substantially rectangular spiral shape on the top surface of the magnetic sheet 4, for example. The remaining portion of the NFC coil 2 is extended (wired) so as to be positioned in the vicinity of the power supply coil 1 on the bottom surface of the magnetic sheet 4.

A resonance capacitor 7 is connected to the ends of the NFC coil 2. The NFC coil 2 and the resonance capacitor 7 define a resonance circuit, and the resonance circuit resonates at the frequency (13.56 MHz) of a near field communication signal or at a frequency near the frequency of the near field communication signal.

A portion of the non-contact charging coil 3 is bent so as to extend from the top surface of the magnetic sheet 4 to the bottom surface of the magnetic sheet 4 as a result of the base material sheet 5 being bent. The non-contact charging coil 3 includes a portion having a spiral shape on the top surface of the magnetic sheet 4. The end portions of the non-contact charging coil 3 are extended so as to define a connection terminal 31. A pin terminal 62 is in contact with and directly coupled (DC-connected) to the connection terminal 31 on the bottom surface of the magnetic sheet 4.

The printed wiring board 6 includes a near field communication circuit, and the power supply coil 1 is connected to the near field communication circuit. In addition, the printed wiring board 6 includes a non-contact charging circuit, and the pin terminal 62 is connected to the non-contact charging circuit.

Figure 2:
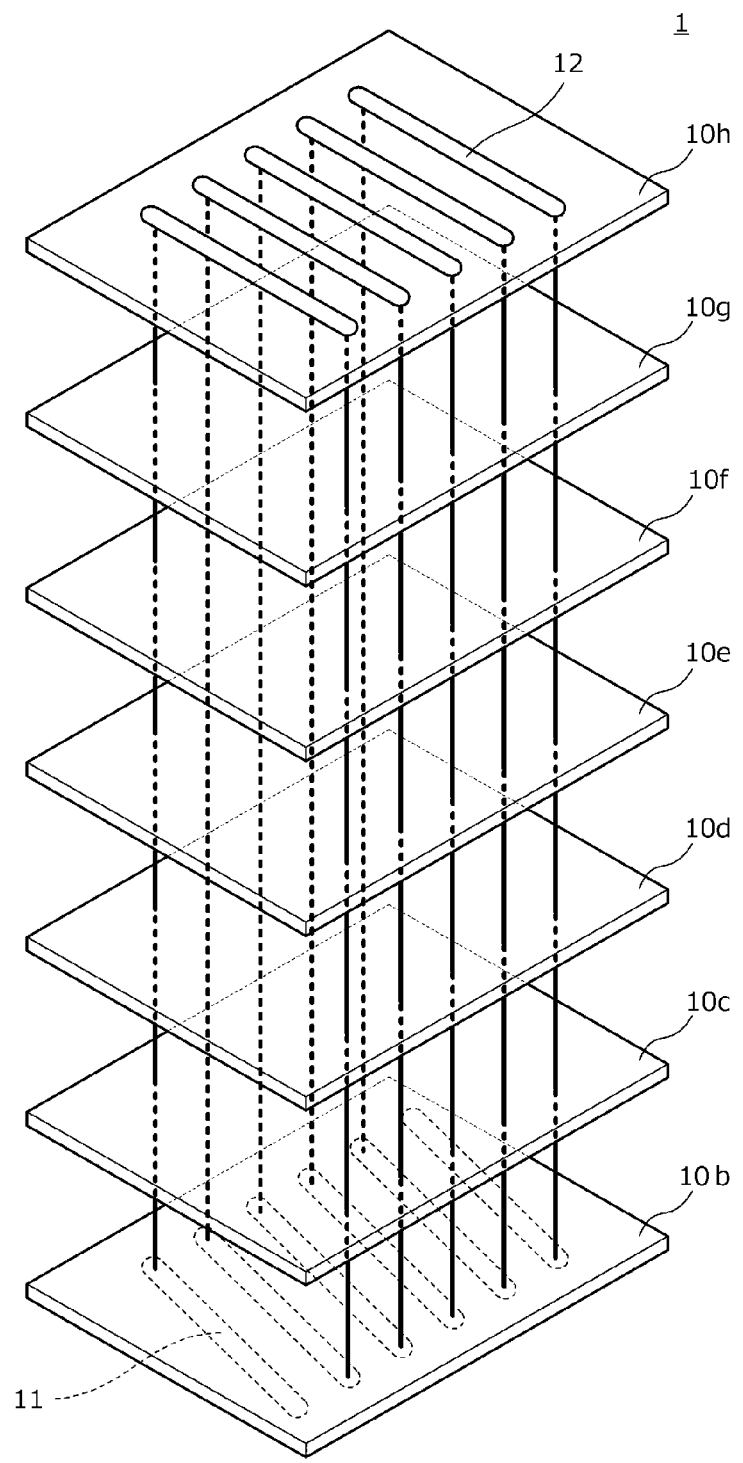
FIG. 2 is an exploded perspective view of a power supply coil 1.
Figure 3:
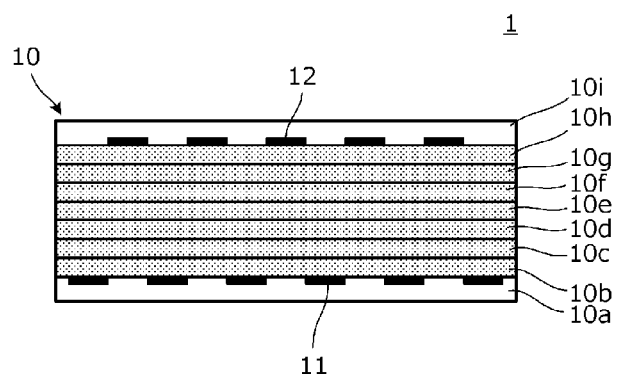
FIG. 3 is a cross-sectional view of the power supply coil 1.

FIG. 2 is an exploded perspective view of the power supply coil 1, and FIG. 3 is a cross-sectional view of the power supply coil 1. The power supply coil 1 includes a multilayer substrate 10 that includes a plurality of sheets $10a$ to $10i$ stacked on top of one another and a coil conductor that is provided on and/or in the multilayer substrate 10. In FIG. 2, the top and bottom non-magnetic layers $10a$ and $10i$ are not illustrated. A plurality of first linear portions 11 of the coil conductor are provided on a bottom surface of the magnetic sheet $10b$. A plurality of second linear portions 12 of the coil conductor are provided on a top surface of the magnetic sheet $10h$. A plurality of via conductors (interlayer connection conductors) of the coil conductor are provided in the magnetic sheets $10b$ to $10h$. The linear portions 11 and 12 and the via conductors define a portion of the power supply coil 1 that includes a horizontal or substantially horizontal helical coil conductor that is structured so as to follow the shape of a flat square or substantially square cylinder, for example.

The non-contact charging coil 3 is superposed with the NFC coil 2 when viewed in plan view, and the power supply coil 1 is positioned such that the shortest distance between the power supply coil 1 and the NFC coil 2 is smaller than the shortest distance between the power supply coil 1 and the non-contact charging coil 3. Note that the shortest distance between the power supply coil 1 and the NFC coil 2 is a distance D1 from a portion of a coil conductor of the NFC coil 2, the portion being closest to the power supply coil 1 (the portion of the coil conductor that is located on the bottom surface of the magnetic sheet 4 in FIG. 1B), to the power supply coil 1, as shown, for example, in FIG. 1B. The shortest distance between the power supply coil 1 and the non-contact charging coil 3 is a distance D2 from a portion of a coil conductor of the non-contact charging coil 3, the portion being closest to the power supply coil 1, to the power supply coil 1, as shown, for example, in FIG. 1B.

The magnetic sheet 4 is superposed with the non-contact charging coil 3 and the NFC coil 2 when viewed in plan.

The power supply coil 1 includes a magnetic core and the coil conductor that is wound around the magnetic core, and a coil winding axis direction of the coil conductor crosses or intersects with a coil winding axis direction of the NFC coil 2.

The power supply coil 1 is positioned in an area inside the non-contact charging coil 3 when viewed in plan view.

The power supply coil 1 is disposed at a position that is superposed with the central axis of the non-contact charging coil 3 when viewed in plan.

A coupling portion in which the NFC coil 2 and the power supply coil 1 are coupled to each other is located on the rear side of the magnetic sheet 4, as seen from the non-contact charging coil 3.

As illustrated in FIG. 1B, in a portion of the NFC coil 2, the portion being wired to the bottom surface of the magnetic sheet 4, the NFC coil 2 is coupled with the power supply coil 1 via a magnetic field. In FIG. 1B, dashed lines $\varphi 1$ conceptually indicate a magnetic flux that contributes to the coupling.

The NFC coil 2 is in a magnetic field coupling relationship with an antenna coil of a communication target. Similarly, the non-contact charging coil 3 is in a magnetic field coupling relationship with a target coil for non-contact charging. In FIG. 1B, dashed lines $\varphi 2$ and $\varphi 3$ denote magnetic fluxes that contribute to these couplings.

Advantageous effects obtained with a configuration in which a coil for use in near field communication includes the NFC coil 2 and the power supply coil 1, which is coupled with the NFC coil 2, and in which the power supply coil 1 is spaced away from the non-contact charging coil 3 and advantageous effects obtained with a configuration in which the NFC coil 2 resonates at the frequency of near field communication will now be described. However, since the following experiments are confirmatory experiments, an NFC coil 2 that preferably has, for example, an external size of about 35 mm and that is wound by four turns was manufactured so as to correspond to the size of the non-contact charging coil having an external size of about 35 mm and was superposed with the non-contact charging coil 3 in order to intentionally cause the NFC coil 2 to be easily coupled to the non-contact charging coil 3.

Confirmatory Experiment 1

An experiment to confirm the influence of a magnetic field used for non-contact charging on a near field communication circuit system was conducted.

First, the voltage at the ends of the NFC coil induced by coupling of the NFC coil and the non-contact charging coil was measured. When the frequency of the magnetic field used for non-contact charging was set to about 200 kHz, and the NFC coil did not resonate, the voltage at the ends of the NFC coil was about 9.56 V, that is, a very high voltage was induced. Next, when the voltage induced in the power supply coil in a state where a resonance capacitor was connected to the NFC coil, and where a resonant frequency was set to about 13.56 MHz, the voltage was about 2.44 V, which is a sufficiently low value.

Confirmatory Experiment 2

An experiment to confirm the influence of the NFC coil, which was disposed in the vicinity of a non-contact charging circuit system, on the non-contact charging circuit system was conducted.

First, the voltage induced in the non-contact charging coil before the NFC coil was attached to the non-contact charging coil was about 22.05 V, and the voltage induced in the non-contact charging coil when the NFC coil whose ends were in an open state was attached to the non-contact charging coil was about 22.36 V. In this state, when the resonance capacitor was connected to the NFC coil, and the resonant frequency was set to about 13.56 MHz, the voltage induced in the non-contact charging coil was about 22.40 V. In addition, also when the power supply coil was coupled to the NFC coil, the voltage induced in the non-contact charging coil was about 22.40 V. That is to say, the influence of the NFC coil, which is disposed in the vicinity of the non-contact charging circuit system, on the non-contact charging circuit system is negligible.

Note that, when a resistor having a resistance of about 20Ω was connected to the ends of the NFC coil, the voltage induced in the non-contact charging coil was about 18.80 V, that is, the voltage was decreased by about 17%. As described above, although the non-contact charging circuit system is influenced by the Q value of the NFC coil, in practice, the NFC coil is an LC resonance circuit and has a high Q value, and thus, there will be no problem.

According to preferred embodiments of the present preferred embodiment, the following advantageous effects are obtained.

Since the power supply coil 1 is disposed at the center of the non-contact charging coil 3, and the coil winding axis direction of the power supply coil 1 and the coil winding axis direction of the non-contact charging coil 3 are perpendicular or substantially perpendicular to each other, the non-contact charging coil 3 and the power supply coil 1 are rarely coupled to each other. Although a coil opening of the non-contact charging coil 3 and a coil opening of the NFC coil 2 are superposed with each other, the NFC coil 2 resonates at the frequency (13.56 MHz) of near field communication and does not resonate at a frequency (e.g., about 200 kHz/7 MHz) of non-contact charging. Thus, mutual interference between a non-contact charging system and the near field communication system is effectively reduced or prevented.

The NFC coil 2 and the resonance capacitor 7 define and function as a band-pass filter for an NFC signal. In other words, since this band-pass filter allows the NFC signal to pass therethrough and blocks a non-contact charging signal (magnetic field), a high voltage for non-contact charging from a power-transmitting device for non-contact charging (a target) will not enter an IC for NFC, and the IC is prevented from being damaged or broken.

In addition, since the power supply coil 1 and the NFC coil 2 are not directly coupled (DC-connected) to each other and are coupled to each other via a magnetic field, and the non-contact charging coil 3 and the power supply coil 1 are rarely coupled to each other while the NFC coil 2 and the non-contact charging coil 3 are coupled to each other, interference between the non-contact charging circuit and the near field communication circuit is effectively reduced or prevented while ensuring a sufficient function of the near field communication system. Furthermore, since the NFC coil 2 and the non-contact charging coil 3 are able to be arranged so as to be close to each other, the degree of freedom when designing the NFC coil 2 is large.

Although a ground electrode 61 having a planar or substantially planar configuration is provided in the printed wiring board 6, the magnetic sheet 4 is disposed between the non-contact charging coil 3 and the principal portion of the NFC coil 2 and the ground electrode 61. Thus, an eddy current generated by the non-contact charging coil and an eddy current generated by the NFC coil 2 is prevented from being induced in the ground electrode 61.

Although a communication coil and a magnetic member are usually required in near field communication, as a result of a magnetic material that is used as a magnetic core of a non-contact charging coil (non-contact charging coil 3) being in the vicinity of an NFC coil, a new magnetic member for near field communication is not required or necessary.

Second Preferred Embodiment

Figure 4:
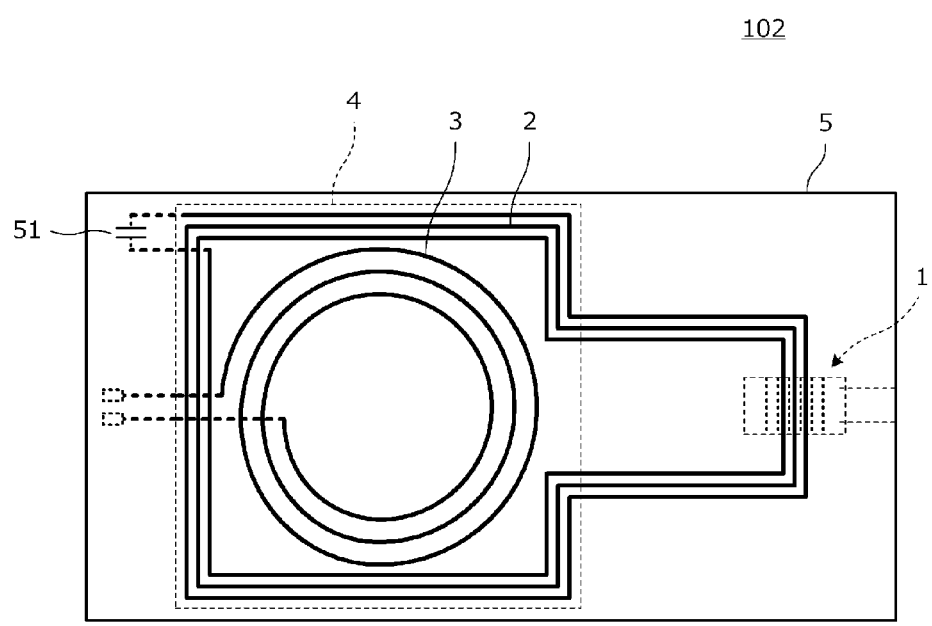
FIG. 4 is a plan view of an antenna device 102 according to a second preferred embodiment of the present invention.

FIG. 4 is a plan view of an antenna device 102 according to a second preferred embodiment of the present invention. FIG. 5A is a cross-sectional view of an electronic device 202, such as a mobile terminal, in which the antenna device 102 is included, and FIG. 5B is a cross-sectional view of a portion of the electronic device 202 in which the antenna device 102 is included and that is surrounded by a dashed line illustrated in FIG. 5A.

The antenna device 102 according to the present preferred embodiment includes a power supply coil 1, an NFC coil 2, a non-contact charging coil 3, and a magnetic sheet 4. As illustrated in FIG. 5A, the antenna device 102 is disposed in the interior of a housing 8. A printed wiring board 6, a battery pack 81, and other suitable components are disposed in the housing 8. A display 82 with a touch panel is provided on a display-operation surface of the electronic device 202.

The power supply coil 1 is mounted on the printed wiring board 6. The NFC coil 2 and the non-contact charging coil 3 are located on a top surface of a base material sheet 5. On a bottom surface of the base material sheet 5, the magnetic sheet 4 is disposed at a position that is superposed with a portion of the NFC coil 2 and the non-contact charging coil 3 when viewed in plan view.

The base material sheet 5, on which the NFC coil 2 and the non-contact charging coil 3 are disposed, and the magnetic sheet 4 are bonded together. In addition, the base material sheet 5 is bonded to an inner surface of the housing 8 with a bonding layer 51 interposed therebetween.

A principal portion of the NFC coil 2 includes a portion having a rectangular or substantially rectangular spiral shape on a top surface of the magnetic sheet 4. The remaining portion of the NFC coil 2 is extended so as to be positioned in the vicinity of the power supply coil 1 at a position that is not superposed with the magnetic sheet 4.

As illustrated in FIG. 4, a resonance capacitor 7 is connected to the ends of the NFC coil 2. The NFC coil 2 and the resonance capacitor 7 define a resonance circuit, and the resonance circuit resonates at the frequency (13.56 MHz) of a near field communication signal or at a frequency around the frequency of the near field communication signal.

The non-contact charging coil 3 includes a portion having a spiral shape disposed on the top surface of the magnetic sheet 4. A portion of the non-contact charging coil 3 is wired to a position at which the portion of the non-contact charging coil 3 and a pin terminal 62 are in contact with each other.

A near field communication IC 63, a non-contact charging IC 64, and passive components 65 and 66, such as a chip capacitor and a chip inductor, for example, are mounted on the printed wiring board 6. The power supply coil 1 is connected to a near field communication circuit that includes the near field communication IC 63. The pin terminal 62 is connected to a non-contact charging circuit that includes the non-contact charging IC 64.

The non-contact charging coil 3 is superposed with the NFC coil 2 when viewed in plan view, and the power supply coil 1 is positioned such that the shortest distance between the power supply coil 1 and the NFC coil 2 is smaller than the shortest distance between the power supply coil 1 and the non-contact charging coil 3.

The magnetic sheet 4 is superposed with the non-contact charging coil 3 and the NFC coil 2 when viewed in plan view.

The power supply coil 1 includes a magnetic core and a coil conductor that is wound around the magnetic core, and a coil winding axis direction of the coil conductor crosses or intersects with a coil winding axis direction of the NFC coil 2.

The power supply coil 1 is positioned in an area outside the non-contact charging coil 3 when viewed in plan view.

Figure 6A:
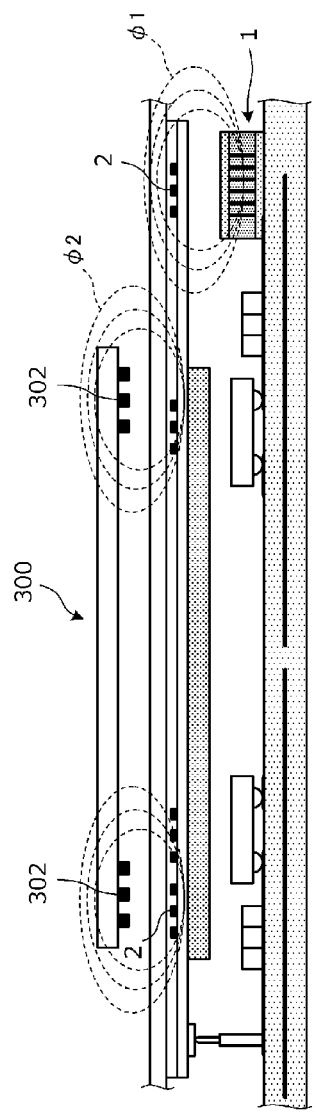
FIG. 6A is a diagram illustrating the state of an NFC coil 2 being coupled to a target communication coil 302 included in a target communication device 300 with which the antenna device 101 performs near field communication.

FIG. 6A is a diagram illustrating a state in which the NFC coil 2 is coupled to a target communication coil 302 included in a target communication device 300 with which the antenna device 101 performs near field communication. The target communication coil 302 is a coil preferably having a spiral shape, for example. The NFC coil 2 faces the target communication coil 302. In FIG. 6A, dashed lines φ2 conceptually indicate a magnetic flux that contributes to coupling of the target communication coil 302 and the NFC coil 2. In a portion of the NFC coil 2 that is extended to an area outside the magnetic sheet 4 when viewed in plan view, the NFC coil 2 is coupled to the power supply coil 1 via a magnetic field. In FIG. 6A, dashed lines φ1 conceptually indicate a magnetic flux that contributes to the coupling.

Figure 6B:
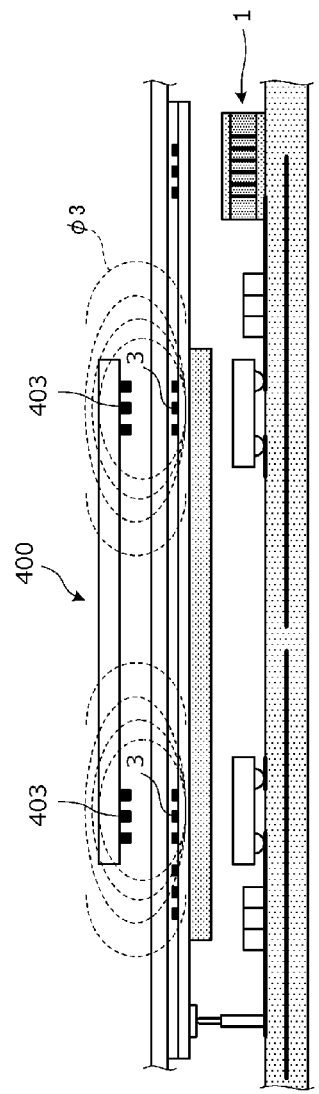
FIG. 6B is a diagram illustrating the state of a non-contact charging coil 3 being coupled to a charging table coil 403 that is included in a charging table 400.

FIG. 6B is a diagram illustrating a state in which the non-contact charging coil 3 is coupled to a charging table coil 403 that is included in a charging table 400. The charging table coil 403 is a coil preferably having a spiral shape, for example. The charging table coil 403 faces the non-contact charging coil 3. In FIG. 6B, dashed lines φ3 conceptually indicate a magnetic flux that contributes to coupling of the charging table coil 403 and the non-contact charging coil 3. Since the power supply coil 1 is located at a position spaced apart from the non-contact charging coil 3, the power supply coil 1 is also located at a position spaced apart from the charging table coil 403. Thus, the power supply coil 1 will not be unnecessarily coupled to the charging table coil 403, and a magnetic field for non-contact charging will not adversely affect the near field communication circuit.

The battery pack 81 illustrated in FIG. 5A is a power supply for a circuit that includes the near field communication circuit. The non-contact charging circuit includes a charging circuit that charges the battery pack 81 by using electrical power induced by the non-contact charging coil 3.

Third Preferred Embodiment

Figure 7:
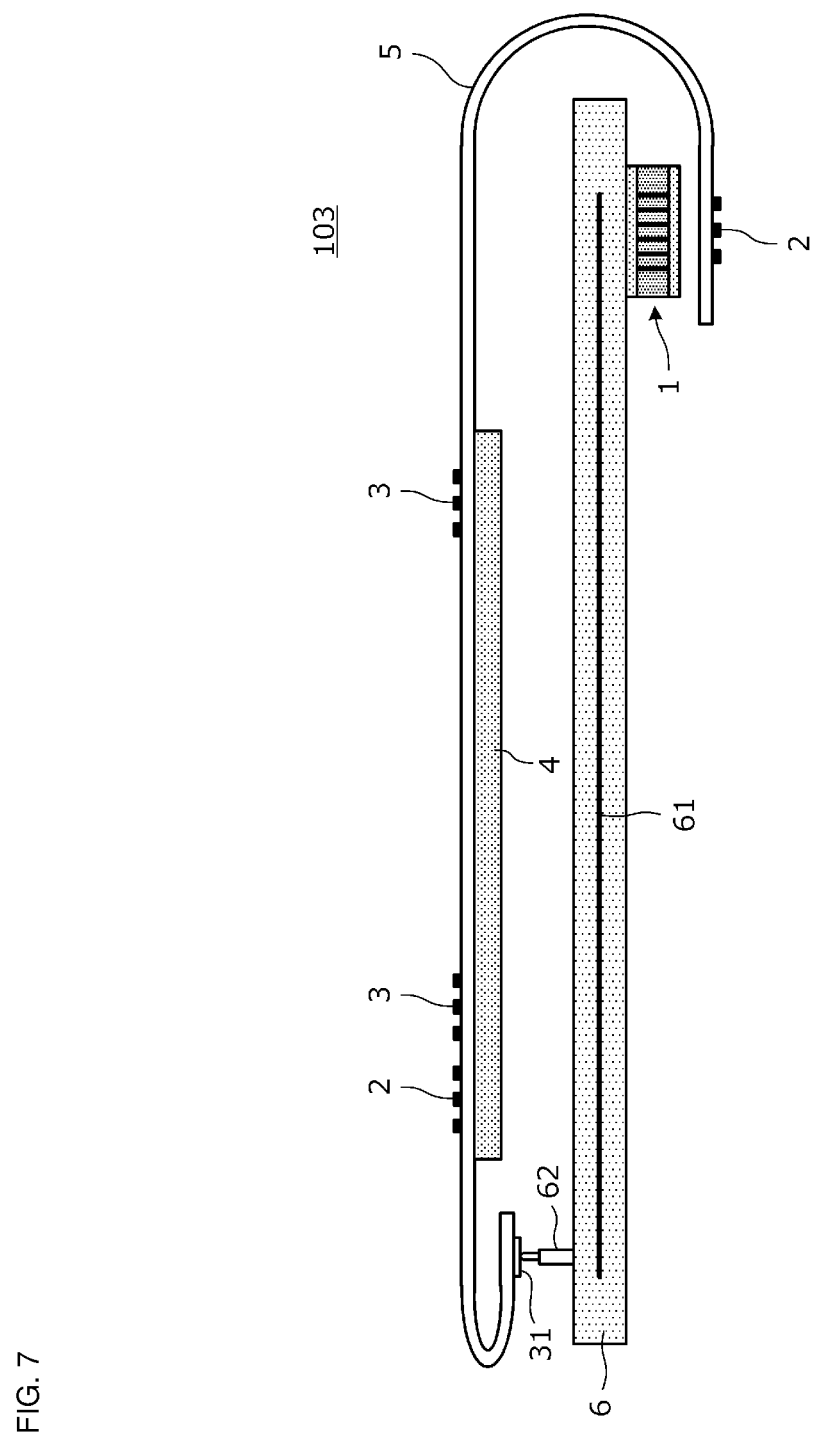
FIG. 7 is a cross-sectional view of an antenna device 103 according to a third preferred embodiment of the present invention.

FIG. 7 is a cross-sectional view of an antenna device 103 according to a third preferred embodiment of the present invention. The antenna device 103 according to the present preferred embodiment includes a power supply coil 1, an NFC coil 2, a non-contact charging coil 3, and a magnetic sheet 4.

The power supply coil 1 is mounted on a printed wiring board 6. The NFC coil 2 and the non-contact charging coil 3 are disposed on a surface of a base material sheet 5. On a bottom surface of the base material sheet 5, the magnetic sheet 4 is disposed at a position that is superposed with a principal portion of the NFC coil 2 and the non-contact charging coil 3 when viewed in plan view. The power supply coil 1 is mounted on a bottom surface of the printed wiring board 6.

The base material sheet 5, on which the NFC coil 2 and the non-contact charging coil 3 are disposed, and the magnetic sheet 4 are bonded together. The configurations of the NFC coil 2 and the non-contact charging coil 3 are the same or substantially the same as those described in the first preferred embodiment. However, the principal portion of the NFC coil 2 includes a portion having a rectangular or substantially rectangular spiral shape on a top surface of the magnetic sheet 4, and the remaining portion of the NFC coil 2 is extended so as to be positioned in the vicinity of the power supply coil 1. In addition, a principal portion of the non-contact charging coil includes a portion having a spiral shape on the top surface of the magnetic sheet 4, and the remaining portion of the non-contact charging coil is extended to a position at which the remaining portion of the non-contact charging coil is in contact with a pin terminal 62.

Even if the power supply coil 1 is mounted on the bottom surface of the printed wiring board 6 as in the present preferred embodiment, the power supply coil 1 can be coupled to the NFC coil. The power supply coil 1 is farther away from a charging table coil, which faces the non-contact charging coil 3, by disposing the power supply coil 1 on the bottom surface of the printed wiring board 6, and thus, unnecessary coupling of the charging table coil and the power supply coil 1 is effectively reduced or prevented.

Fourth Preferred Embodiment

Figure 8:
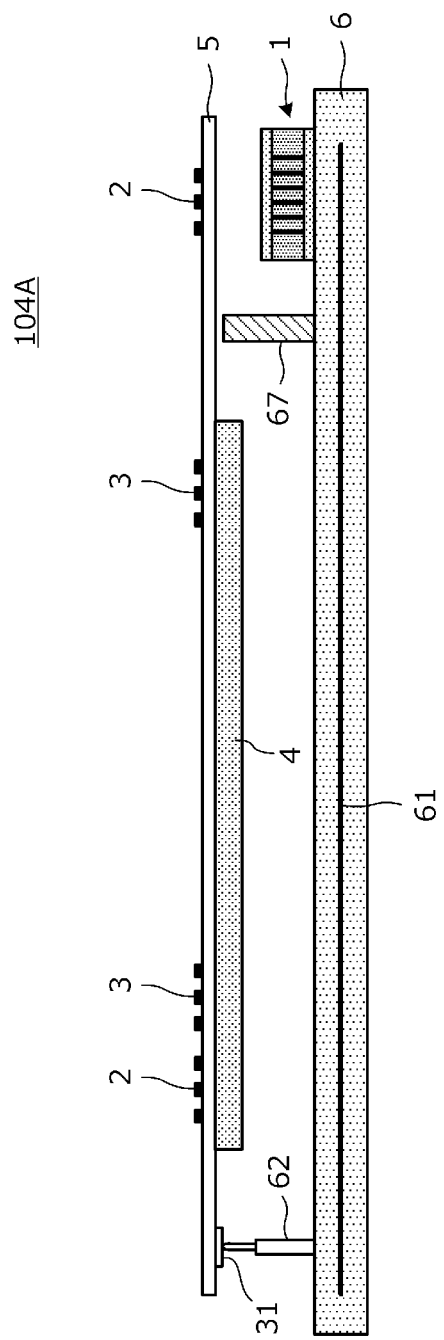
FIG. 8 is a cross-sectional view of an antenna device 104A according to a fourth preferred embodiment of the present invention.
Figure 9:
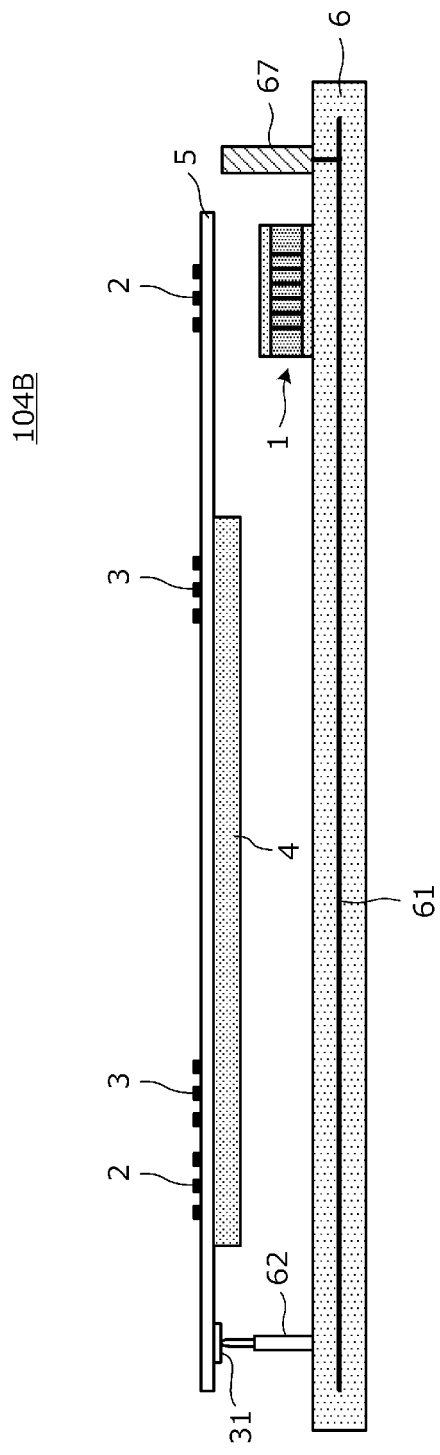
FIG. 9 is a cross-sectional view of another antenna device 104B according to the fourth preferred embodiment of the present invention.
Figure 10:
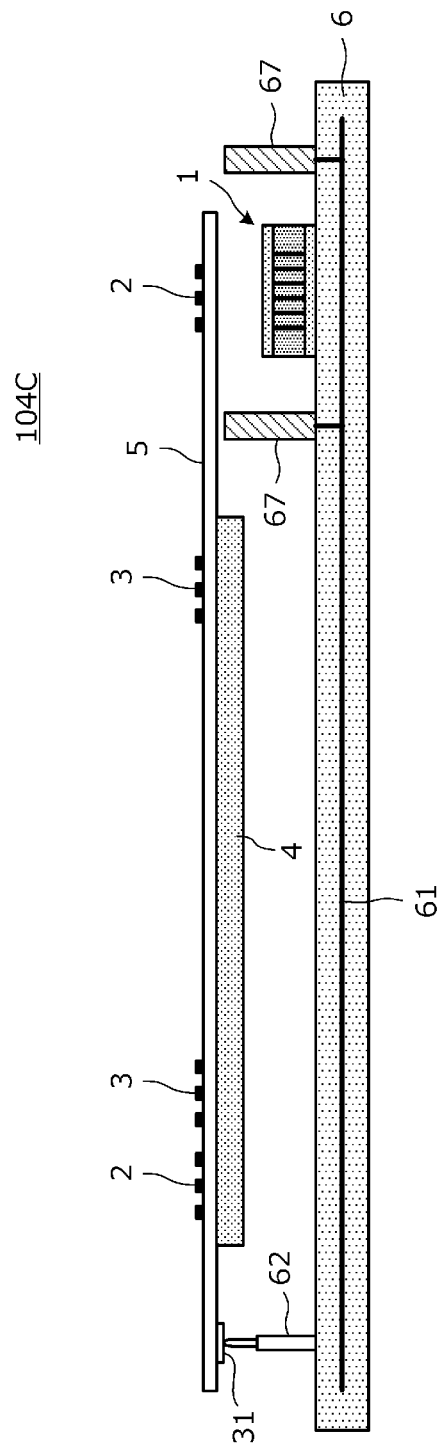
FIG. 10 is a cross-sectional view of another antenna device 104C according to the fourth preferred embodiment of the present invention.

FIG. 8 is a cross-sectional view of an antenna device 104A according to a fourth preferred embodiment of the present invention. FIG. 9 is a cross-sectional view of another antenna device 104B according to the fourth preferred embodiment of the present invention. FIG. 10 is a cross-sectional view of another antenna device 104C according to the fourth preferred embodiment of the present invention.

In each of the antenna devices 104A, 104B, and 104C according to the present preferred embodiment, a shield member 67 having conductivity, such as a metal plate, for example, is provided on a printed wiring board 6. Each of the shield members 67 is electrically connected to a corresponding one of ground electrodes 61 in order to function as an electrostatic shield. The rest of the configuration of each of the antenna devices 104A, 104B, and 104C is the same or substantially the same as that of the antenna device illustrated in FIG. 5B.

Note that, in order to cause each of the shield members 67 to function only as an electromagnetic shield, it is not necessary to electrically connect the shield member 67 to the corresponding ground electrode 61. It is preferable that each of the shield members 67 have a surface extending perpendicularly or substantially perpendicular to a direction in which the corresponding non-contact charging coil 3 and the corresponding power supply coil 1 face each other in order to further prevent the non-contact charging coil 3 and the power supply coil 1 from being coupled to each other.

In the case of the antenna device 104A illustrated in FIG. 8, the shield member 67 is disposed between the power supply coil 1 and the non-contact charging coil 3. Thus, the power supply coil 1 is electromagnetically shielded from a magnetic flux that passes through the non-contact charging coil 3 as a result of a charging table coil and the non-contact charging coil 3 being coupled to each other.

In the case of the antenna device 104B illustrated in FIG. 9, the shield member 67 is disposed in the vicinity of the power supply coil 1 and is positioned farther from the non-contact charging coil 3 than the power supply coil 1 is, as seen from the non-contact charging coil 3. Also in this configuration, the shield member 67 prevents a magnetic flux that passes through the non-contact charging coil 3 from leaking to the power supply coil 1.

In the case of the antenna device 104C illustrated in FIG. 10, the shield members 67 are disposed on both sides of a coil opening of the power supply coil 1. Thus, unnecessary coupling of the power supply coil 1 and a charging table coil and unnecessary coupling of the power supply coil 1 and the non-contact charging coil 3 are more effectively reduced or prevented.

Note that, although the shield members 67 each having conductivity are preferably provided in the present preferred embodiment, a shield member that is disposed for a different purpose (e.g., a shield member that surrounds an IC) or a member, such as a battery pack, that has conductivity and that hinders unnecessary coupling of the power supply coil 1 and the non-contact charging coil 3 can also be used as each of the shield members 67 according to the present preferred embodiment.

Note that, although the shield members 67 having conductivity are each preferably provided in order to electromagnetically shield the corresponding power supply coil 1 and the corresponding non-contact charging coil 3 from each other in the present preferred embodiment, in order to cause each of the shield members 67 to function only as a magnetic shield, the shield member 67 may be a member having magnetism, and it is not necessary for the shield member 67 to have conductivity.

Fifth Preferred Embodiment

Figure 11A:
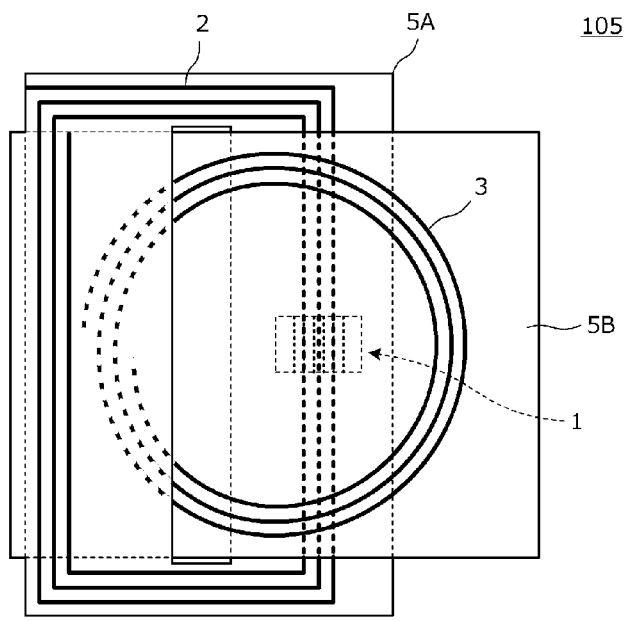
FIG. 11A is a plan view of an antenna device 105 according to a fifth preferred embodiment of the present invention.
Figure 11B:
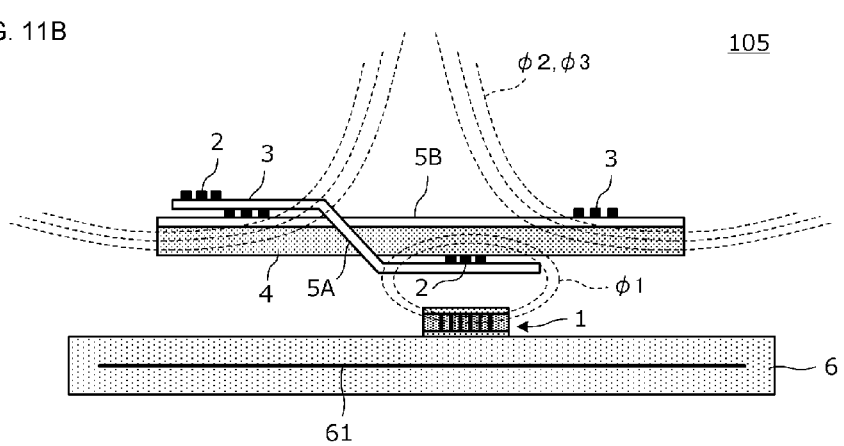
FIG. 11B is a cross-sectional view of the antenna device 105.

FIG. 11A is a plan view of an antenna device 105 according to a fifth preferred embodiment of the present invention, and FIG. 11B is a cross-sectional view of the antenna device 105.

An NFC coil 2 is disposed on a surface of a base material sheet 5A. A non-contact charging coil 3 is disposed on a surface of a base material sheet 5B. A slit-shaped opening is provided in the base material sheet 5A, and the NFC coil 2 having a rectangular or substantially rectangular spiral shape is disposed around the periphery of the opening. The base material sheet 5B is attached to a top surface of a magnetic sheet 4, and the magnetic sheet 4 and the base material sheet 5B are inserted in the opening of the base material sheet 5A. A power supply coil 1 is mounted on a printed wiring board 6. The power supply coil 1 is disposed at a position in the vicinity of a portion of the NFC coil 2.

Note that a resonance capacitor that is connected to the NFC coil 2 and a connection terminal that is extended from the non-contact charging coil 3 are not illustrated in FIG. 11A.

According to the present preferred embodiment, the power supply coil 1 and the NFC coil 2 can be coupled to each other without including a special extending pattern on the NFC coil 2. In addition, since the magnetic sheet 4 is inserted in a coil opening of the NFC coil 2, the degree of coupling of the NFC coil 2 and a target communication coil is increased, and desired communication characteristics are obtained even if the area occupied by the NFC coil 2 is small.

Sixth Preferred Embodiment

Figure 12A:
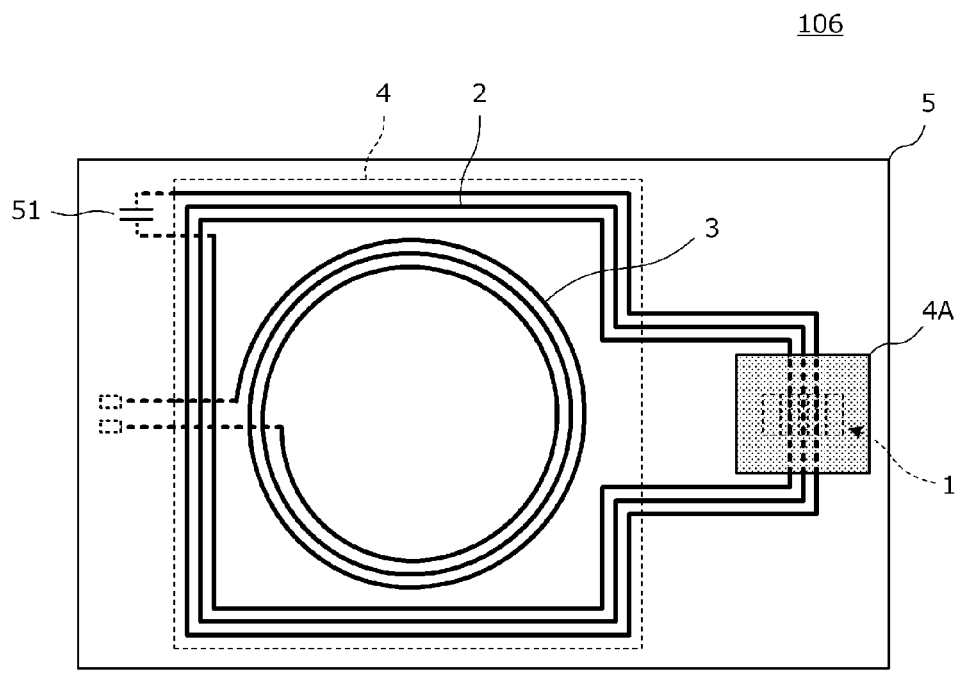
FIG. 12A is a plan view of an antenna device 106 according to a sixth preferred embodiment of the present invention.
Figure 12B:
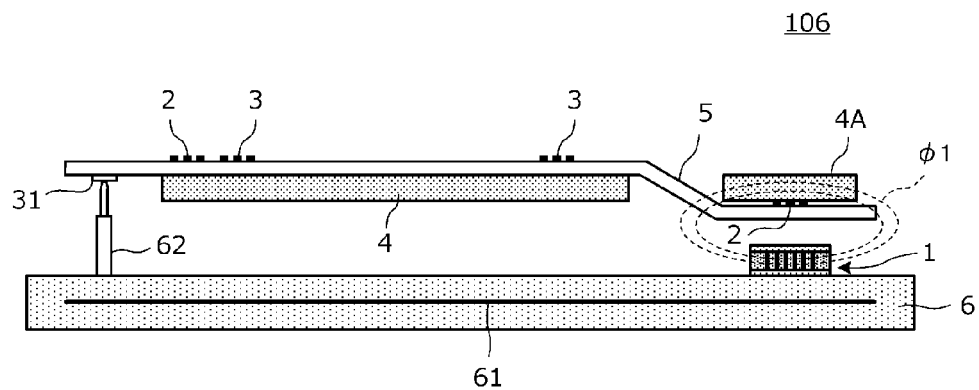
FIG. 12B is a cross-sectional view of the antenna device 106.

FIG. 12A is a plan view of an antenna device 106 according to a sixth preferred embodiment of the present invention, and FIG. 12B is a cross-sectional view of the antenna device 106. The difference from the antenna device according to the second preferred embodiment illustrated in FIG. 4 and FIG. 5B is that the antenna device 106 includes a magnetic sheet 4A. The magnetic sheet 4A is attached to a base material sheet 5 such that the magnetic sheet 4A and a power supply coil 1 have a positional relationship in which an extended portion of an NFC coil 2 is interposed between the magnetic sheet 4A and the power supply coil 1. Consequently, a magnetic flux $\varphi 1$ that contributes to coupling of the power supply coil 1 and the NFC coil 2 passes through the magnetic sheet 4A, which is positioned in the vicinity of the extended portion of the NFC coil 2, and thus, the degree of coupling of the power supply coil 1 and the NFC coil 2 is large.

Seventh Preferred Embodiment

Figure 13A:
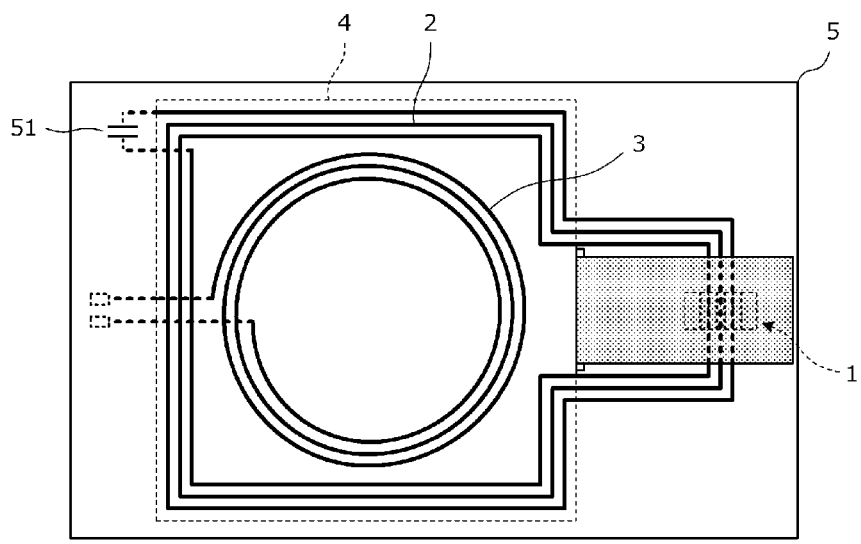
FIG. 13A is a plan view of an antenna device 107 according to a seventh preferred embodiment of the present invention.
Figure 13B:
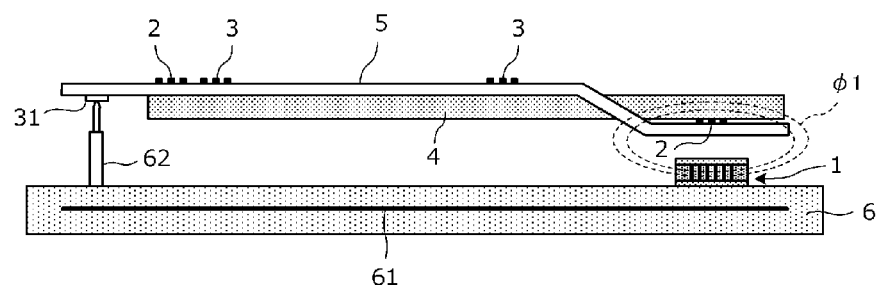
FIG. 13B is a cross-sectional view of the antenna device 107.

FIG. 13A is a plan view of an antenna device 107 according to a seventh preferred embodiment of the present invention, and FIG. 13B is a cross-sectional view of the antenna device 107. The differences from the antenna device according to the second preferred embodiment illustrated in FIG. 4 and FIG. 5B are that a slit-shaped opening is provided in a base material sheet 5 and that a magnetic sheet 4 is inserted in the opening.

An NFC coil 2 and a non-contact charging coil 3 are disposed on a surface of the base material sheet 5. The slit-shaped opening is provided in the base material sheet 5, and a protruding portion of the magnetic sheet 4 is inserted in the opening. The magnetic sheet 4 is located at a position that is superposed with a principal portion of the NFC coil 2 and the non-contact charging coil 3 and is below the principal portion of the NFC coil 2 and the non-contact charging coil 3 when viewed in plan view. In addition, in the vicinity of the power supply coil 1, the magnetic sheet 4 and the power supply coil 1 have a positional relationship in which an extended portion of the NFC coil 2 is interposed between the power supply coil 1 and the magnetic sheet 4.

According to the present preferred embodiment, a magnetic flux $\varphi 1$ that contributes to coupling of the power supply coil 1 and the NFC coil 2 passes through the magnetic sheet 4, and the degree of coupling of the power supply coil 1 and the NFC coil 2 is large.

Eighth Preferred Embodiment

Figure 14A:
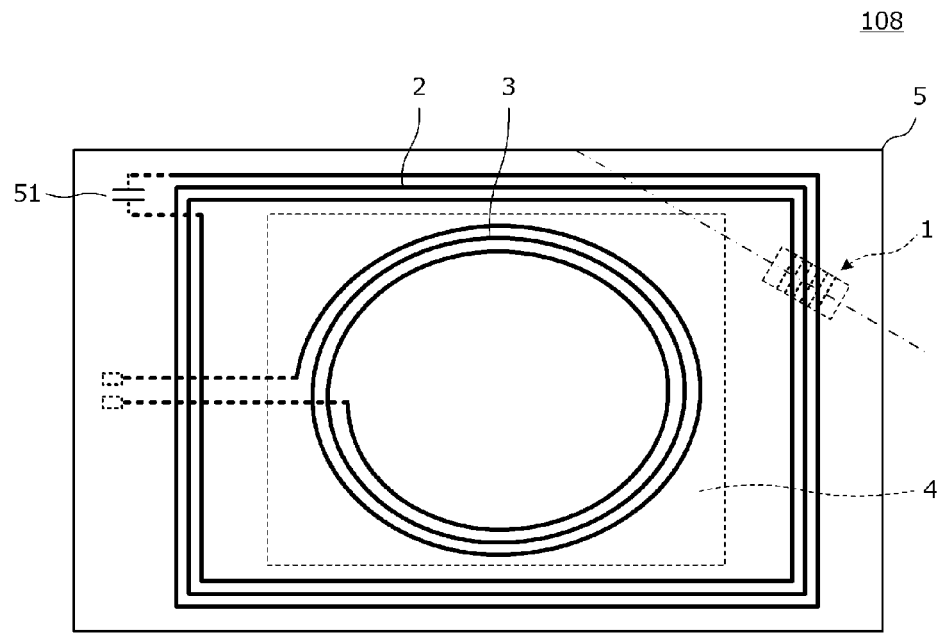
FIG. 14A is a plan view an antenna device 108 according to an eighth preferred embodiment of the present invention.
Figure 14B:
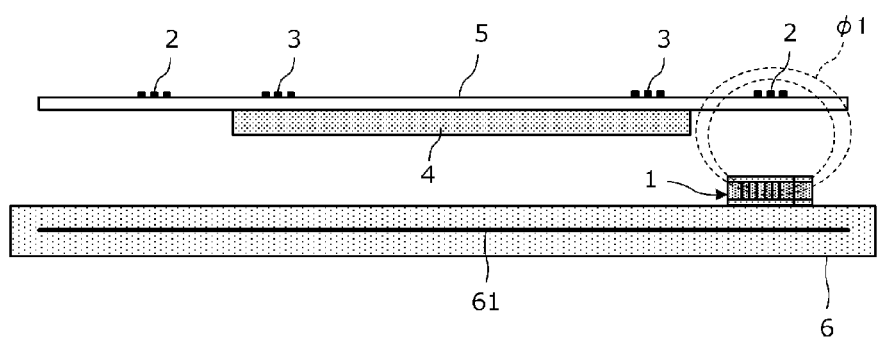
FIG. 14B is a cross-sectional view of the antenna device 108.

FIG. 14A is a plan view an antenna device 108 according to an eighth preferred embodiment of the present invention, and FIG. 14B is a cross-sectional view of the antenna device 108. In this example, a coil winding axis of a coil conductor of a power supply coil 1 is indicated by a one dot chain line. The power supply coil 1 is disposed such that the winding axis extends in the area outside a non-contact charging coil 3. In the present preferred embodiment, an NFC coil 2 is disposed so as to extend around the periphery of a magnetic sheet 4 when viewed in plan view. The overall shape of the power supply coil 1 is preferably a rectangular or substantially rectangular spiral shape, and the power supply coil 1 is in the vicinity of a portion of the power supply coil 1. The non-contact charging coil 3 preferably has an elliptical or substantially elliptical spiral shape. The rest of the configuration of the antenna device 108 is the same or substantially the same as that of the antenna device illustrated in FIG. 4.

According to the present preferred embodiment, unnecessary coupling of the power supply coil 1 and the non-contact charging coil 3 is more effectively reduced or prevented. In addition, since the NFC coil 2 is spaced apart from the magnetic sheet 4, there will be no problem even if a magnetic sheet that has a large loss in the frequency band of near field communication is used. In other words, a material suitable for the frequency of non-contact charging is able to be applied to the magnetic sheet 4.

Ninth Preferred Embodiment

Figure 15A:
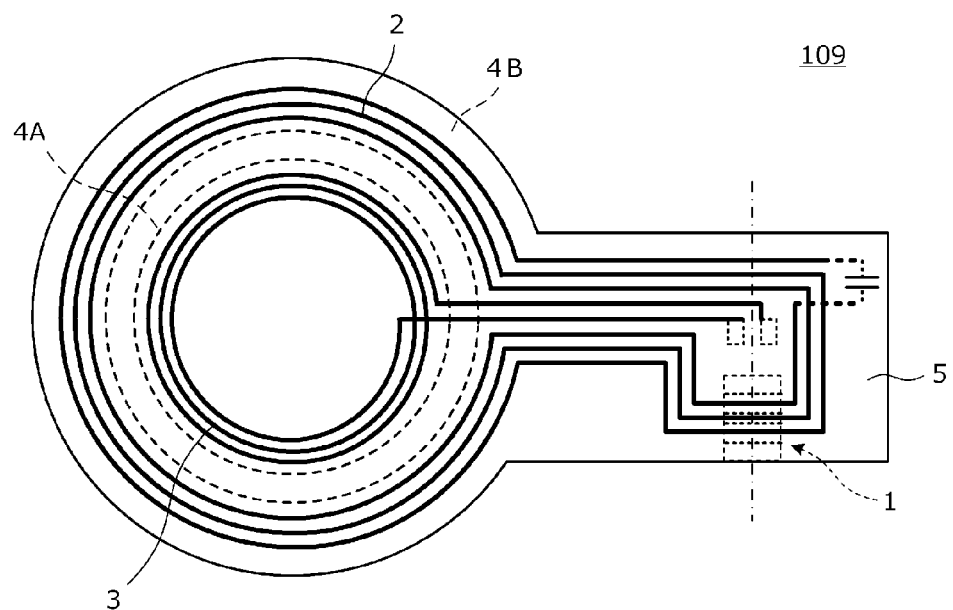
FIG. 15A is a plan view of an antenna device 109 according to a ninth preferred embodiment of the present invention.
Figure 15B:
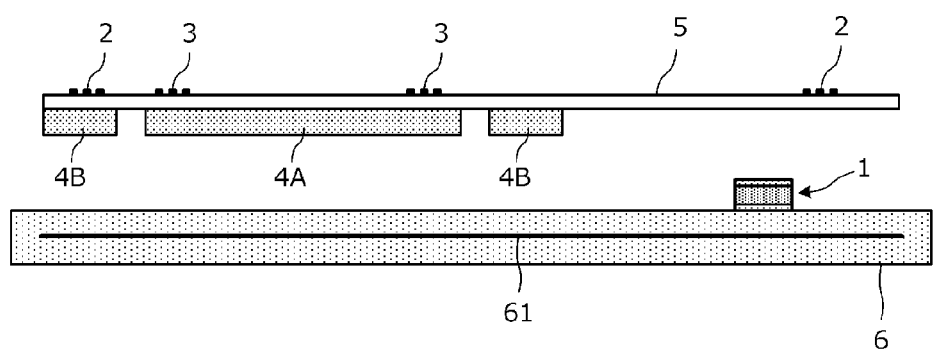
FIG. 15B is a cross-sectional view of the antenna device 109.

FIG. 15A is a plan view of an antenna device 109 according to a ninth preferred embodiment of the present invention, and FIG. 15B is a cross-sectional view of the antenna device 109. In this example, the antenna device 109 includes a circular or substantially magnetic sheet 4A that is superposed with a non-contact charging coil 3 when viewed in plan view and a ring-shaped magnetic sheet 4B that is superposed with an NFC coil 2 when viewed in plan view. In the present preferred embodiment, a principal portion of the NFC coil 2 has a spiral shape that is concentric with the non-contact charging coil. The power supply coil 1 is disposed such that a winding axis (indicated by one dot chain line) of a coil conductor of the power supply coil 1 extends in the area outside the non-contact charging coil 3. The rest of the configuration of the antenna device 109 is the same or substantially the same as that of the antenna device illustrated in FIG. 4 and the like.

According to the present preferred embodiment, the magnetic sheet suitable for the non-contact charging coil is able to be superposed with the non-contact charging coil, and the magnetic sheet suitable for the NFC coil can be superposed with the NFC coil. In other words, a magnetic sheet having a low loss at the frequency of non-contact charging can be used as the magnetic sheet 4A, and a magnetic sheet having a low loss at the frequency of near field communication is able to be used as the magnetic sheet 4B.

Note that the external size of the non-contact charging coil 3 may be larger than the external size of the NFC coil 2. In other words, the non-contact charging coil 3 may be disposed over the entire outer periphery of the NFC coil 2.

Tenth Preferred Embodiment

Figure 16A:
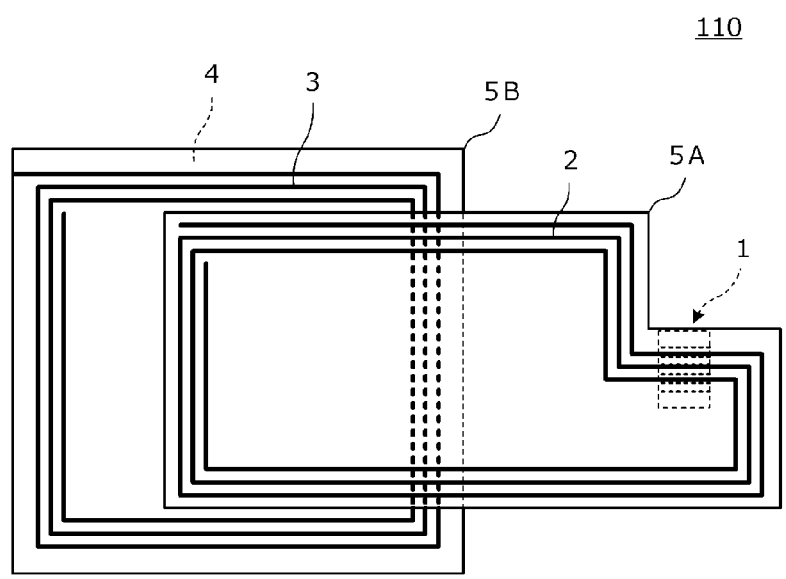
FIG. 16A is a plan view of an antenna device 110 according to a tenth preferred embodiment of the present invention.
Figure 16B:
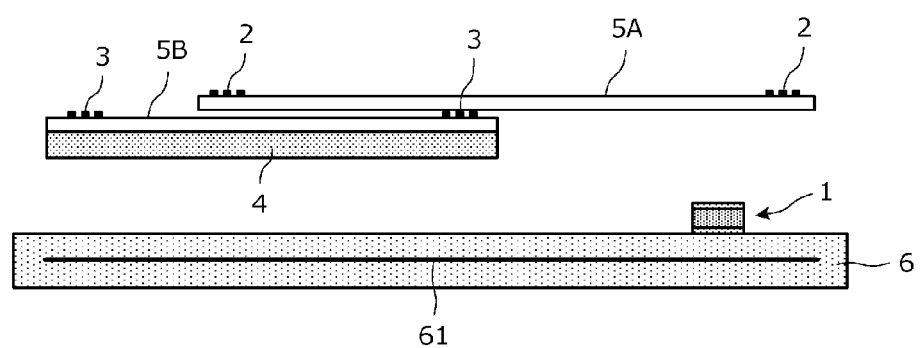
FIG. 16B is a cross-sectional view of the antenna device 110.

FIG. 16A is a plan view of an antenna device 110 according to a tenth preferred embodiment of the present invention, and FIG. 16B is a cross-sectional view of the antenna device 110. In this example, an NFC coil 2 is disposed on a surface of a base material sheet 5A. A non-contact charging coil 3 is disposed on a surface of a base material sheet 5B. The center of gravity of a coil opening of the NFC coil 2 and the center of gravity of a coil opening of the non-contact charging coil 3 are located at positions that are displaced from each other when viewed in plan. Note that the term "the center of gravity" refers to the geometric center of gravity of each of the coil openings and does not refer to the center of gravity of a magnetic flux based on the magnetic flux density in each of the coil openings. Among positions facing a target communication coil when near field communication is performed, the position (hot spot) at which the degree of coupling of the NFC coil 2 and the target communication coil is the largest is in the vicinity of the center of gravity of the coil opening of the NFC coil 2. Similarly, among positions facing a charging table coil when non-contact charging is performed, the position (hot spot) at which the degree of coupling of the non-contact charging coil 3 and the charging table coil is the largest is in the vicinity of the center of gravity of the coil opening of the non-contact charging coil 3. According to the present preferred embodiment, these two hot spots are able to be individually set.

In addition, according to the present preferred embodiment, the power supply coil 1 is disposed at a position further spaced away from the non-contact charging coil 3. Thus, unnecessary coupling of the power supply coil 1 and the non-contact charging coil 3 is more effectively reduced or prevented.

Furthermore, according to the present preferred embodiment, the winding axis of the power supply coil 1 extends in the circumferential direction of the winding axis of the non-contact charging coil 3, and thus, coupling of the power supply coil 1 and the non-contact charging coil 3 is more effectively reduced or prevented.

Eleventh Preferred Embodiment

Figure 17A:
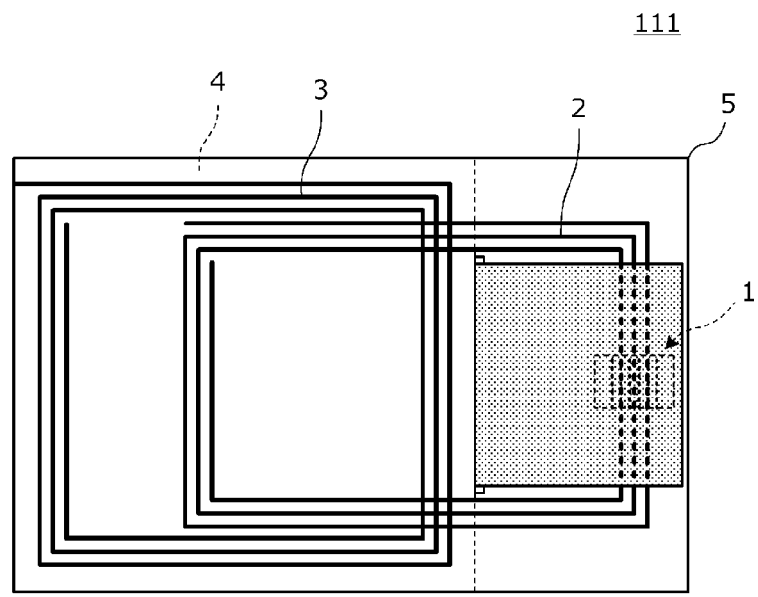
FIG. 17A is a plan view of an antenna device 111 according to an eleventh preferred embodiment of the present invention.
Figure 17B:
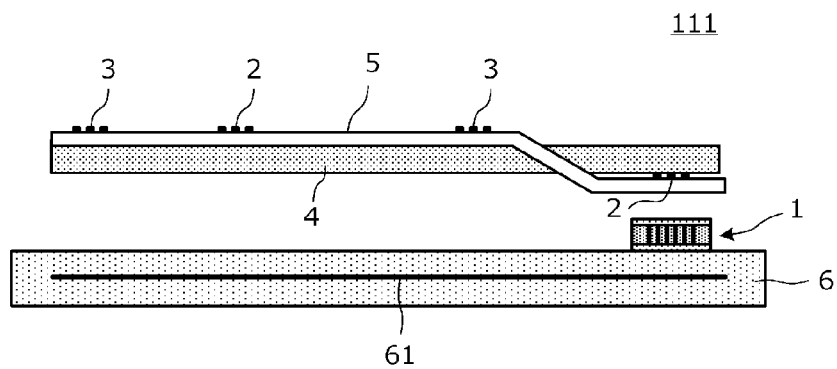
FIG. 17B is a cross-sectional view of the antenna device 111.

FIG. 17A is a plan view of an antenna device 111 according to an eleventh preferred embodiment of the present invention, and FIG. 17B is a cross-sectional view of the antenna device 111. A slit-shaped opening is provided in a base material sheet 5, and a magnetic sheet 4 is inserted in the opening. In this example, the center of gravity of a coil opening of an NFC coil 2 and the center of gravity of a coil opening of a non-contact charging coil 3 are located at positions that are displaced from each other when viewed in plan. Thus, a hot spot of near field communication and a hot spot of non-contact charging is able to be individually set.

Twelfth Preferred Embodiment

Figure 18:
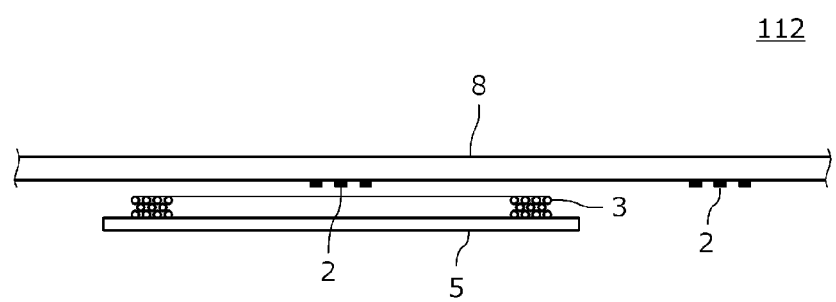
FIG. 18 is a cross-sectional view of a principal portion of an antenna device 112 according to a twelfth preferred embodiment of the present invention.

FIG. 18 is a cross-sectional view of a principal portion of an antenna device 112 according to a twelfth preferred embodiment of the present invention. An NFC coil 2 is disposed on an inner surface of a housing 8. The housing 8 is an engineering plastic compact, and the NFC coil 2 is formed by, for example, a laser direct structuring (LDS) method. A non-contact charging coil 3 is a wire-wound coil preferably has a ring shape and is preferably formed by winding a copper wire a predetermined number of times and is mounted on a base material sheet 5.

An NFC coil that requires only a relatively small number of turns as in the present preferred embodiment may be formed integrally with a housing. The non-contact charging coil 3 that requires a larger number of turns than the NFC coil may be defined by a wire-wound coil. With these configurations, an antenna device that occupies a small area is provided.

Thirteenth Preferred Embodiment

Figure 19:
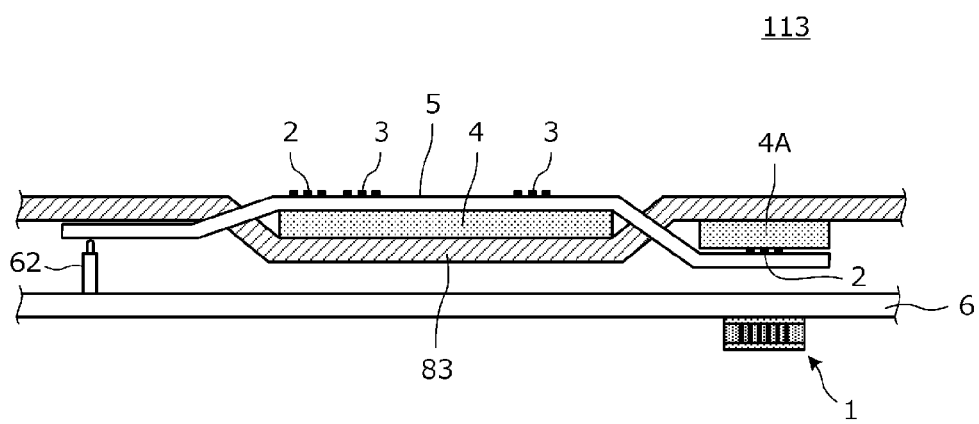
FIG. 19 is a cross-sectional view of a principal portion of an antenna device 113 according to a thirteenth preferred embodiment of the present invention.

FIG. 19 is a cross-sectional view of a principal portion of an antenna device 113 according to a thirteenth preferred embodiment of the present invention. As illustrated in FIG. 19, an NFC coil 2 and a non-contact charging coil 3 are disposed on a top surface of a base material sheet 5. A magnetic sheet 4 is attached to a bottom surface of the base material sheet 5 at a position that is superposed with a principal portion of the NFC coil 2 and the non-contact charging coil 3 when viewed in plan view. A magnetic sheet 4A is attached to a top surface of an extended portion of the NFC coil 2. The base material sheet 5 and the magnetic sheet 4 are disposed along a top surface of a metal member 83.

Two slit-shaped openings are provided in the metal member 83, and two sides of the base material sheet 5 that oppose each other are inserted in the two openings of the metal member 83. A power supply coil 1 is mounted on a bottom surface of a printed wiring board 6 at a position in the vicinity of the extended portion of the NFC coil 2. The pin terminal 62 is provided on the printed wiring board 6, and two terminals of the non-contact charging coil are connected to this pin terminal.

According to the present preferred embodiment, since the metal member 83, which is an example of a conductive member, is interposed between the non-contact charging coil 3 and the power supply coil 1, the non-contact charging coil 3 and the power supply coil 1 are prevented, with higher certainty, from being unnecessarily coupled to each other.

Note that, in the present preferred embodiment, the power supply coil 1 is disposed on a surface of the printed wiring board 6, the surface being opposite to a surface of the printed wiring board 6 that faces the NFC coil 2. Although the ground electrode 61 having a planar or substantially planar shape preferably is disposed in the printed wiring board 6 in the above-described preferred embodiments, the ground electrode 61 is not provided in the present preferred embodiment. In a configuration in which a conductive member, such as the ground electrode 61, that defines and functions as an electromagnetic shield is not disposed between the power supply coil 1 and the NFC coil 2 as in the present preferred embodiment, the power supply coil 1 may be disposed on the surface of the printed wiring board 6, the surface being opposite to the surface of the printed wiring board 6 that faces the NFC coil 2.

Fourteenth Preferred Embodiment

Figure 20:
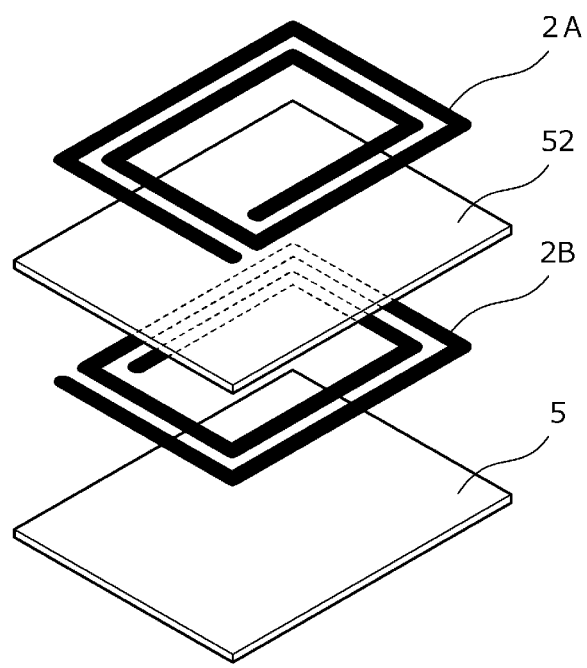
FIG. 20 is an exploded perspective view of an NFC coil that is included in an antenna device according to a fourteenth preferred embodiment of the present invention.

Another example of the NFC coil will be described in the fourteenth preferred embodiment of the present invention. FIG. 20 is an exploded perspective view of an NFC coil according to the present preferred embodiment. The NFC coil includes a base material sheet 5, an insulating base member 52, a first coil 2A, and a second coil 2B. Each of the first coil 2A and the second coil 2B is a conductor, which preferably has a rectangular or substantially rectangular spiral shape, and is patterned so as to be capacitively coupled to each other in a state where a current flows through the first coil 2A and the second coil 2B in the same direction when viewed in plan. Two coil conductors are patterned so that, when a current flows through one of the coil conductors in a clockwise direction, the current also flows through the other one of the coil conductors in the clockwise direction when viewed in plan from the same direction.

The NFC coil according to the present preferred embodiment includes inductance components of the first coil 2A and the second coil 2B and a capacitance component generated between the first coil 2A and the second coil 2B, so that an LC resonance circuit is defined. Thus, for example, the capacitor 7 that defines and functions as a mounting component such as that illustrated in FIG. 1A is not necessary.

Note that, instead of providing the capacitor 7, the ends of a coil having a spiral shape may be caused to oppose each other so that a capacitance will be generated between the ends. Alternatively, a coil having a spiral shape may be provided on a first main surface of the insulating base member, and only an electrode used to generate a capacitance may be provided on a second main surface of the insulating base member without providing a coil on the second main surface so that a capacitance will be generated between the coil having a spiral shape and the electrode.

Although NFC that uses the frequency band of 13.56 MHz has been described as an example of a near field communication system in the above preferred embodiments, preferred embodiments of the present invention can also be applied to other communication systems including, for example, a communication system that uses a frequency band of 5 MHz or less.

Although a case in which a near field communication system and a non-contact charging system are respectively the first transmission system and the second transmission system has been described in the preferred embodiments described above, preferred embodiments of the present invention can also be applied to a configuration in which the non-contact charging system and the near field communication system are respectively the first transmission system and the second transmission system. In this case, a coil and a capacitor each for the non-contact charging system define and function as a band-pass filter of the non-contact charging system. Since a transmission frequency band of the near field communication system and a transmission frequency band of the non-contact charging system are different from each other, the band-pass filter blocks a signal of the near field communication system. As a result, the energy of the signal of the near field communication system that is transmitted from the antenna device to a target is taken in by a circuit included in the non-contact charging system, and near field communication is prevented from being obstructed.

Although a case in which the non-contact charging system has been described as an example of a wireless power transmission system in the above preferred embodiments, preferred embodiments of the present invention can be applied to a system that wirelessly transmits electrical power as well as to a system for a secondary battery.

Although a case in which the present invention is applied to a near field communication system and a wireless power transmission system has been described in the preferred embodiments described above, preferred embodiments of the present invention can also be applied to two near field communication systems conforming to different standards.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna device comprising:
a power supply coil to which a first wireless transmission system circuit is connected;
a first wireless transmission system coil that is coupled to an antenna coil of a transmission target in a first wireless transmission system and to the power supply coil via a magnetic field and that resonates at a transmission frequency of the first wireless transmission system; and
a second wireless transmission system coil that is connected to a second wireless transmission system circuit and that is coupled to an antenna coil of a transmission target in a second wireless transmission system via a magnetic field; wherein
at least a portion of a coil opening of the second wireless transmission system coil and at least a portion of a coil opening of the first wireless transmission system coil are superposed with each other when viewed in plan view;
the first wireless transmission system coil includes a principal portion and a coupling portion that is coupled to the power supply coil via a magnetic field; and
a shortest distance between the coupling portion of the first wireless transmission system coil and the power supply coil is smaller than a shortest distance between the power supply coil and the second wireless transmission system coil.

2. The antenna device according to claim 1, wherein the coupling portion is located at a position different from a position of a portion of the first wireless transmission system coil, the portion being closest to the second wireless transmission system coil.

3. The antenna device according to claim 1, further comprising:

a magnetic sheet that is superposed with the second wireless transmission system coil when viewed in plan view.

4. The antenna device according to claim 3, wherein
the magnetic sheet is positioned in a vicinity of the first wireless transmission system coil;
at least a portion of the first wireless transmission system coil is located out of a vicinity range of the magnetic sheet; and
the power supply coil is disposed at a position where the power supply coil is in a magnetic field coupling relationship with the coupling portion of the first wireless transmission system coil, the position being located out of the vicinity range of the magnetic sheet.

5. The antenna device according to claim 1, wherein the power supply coil is disposed in an area outside the second wireless transmission system coil when viewed in plan view.

6. The antenna device according to claim 5, wherein
the power supply coil includes a magnetic core and a coil conductor that is wound around the magnetic core; and
the power supply coil is disposed such that a coil winding axis of the coil conductor extends in the area outside the second wireless transmission system coil when viewed in plan view.

7. The antenna device according to claim 1, wherein the power supply coil is disposed in an area inside the second wireless transmission system coil when viewed in plan.

8. The antenna device according to claim 1, wherein the power supply coil is disposed at a position that is superposed with a coil winding axis of the second wireless transmission system coil when viewed in plan view.

9. The antenna device according to claim 3, wherein the coupling portion of the first wireless transmission system coil is located on a rear side of the magnetic sheet as seen from the second wireless transmission system coil.

10. The antenna device according to claim 9, wherein the principal portion of the first wireless transmission system coil is located on a surface of the magnetic sheet on which the second wireless transmission system coil is located.

11. The antenna device according to claim 10, wherein the first wireless transmission system coil is provided on a base material sheet that is bent, and as a result of the base material sheet being bent, the coupling portion of the first wireless transmission system coil is positioned on a side opposite to a side on which the principal portion of the first wireless transmission system coil is positioned with respect to the magnetic sheet.

12. The antenna device according to claim 10, wherein the first wireless transmission system coil is provided on a base material sheet that has an opening, and the magnetic sheet is inserted into the opening of the base material sheet such that the coupling portion of the first wireless transmission system coil is positioned on a side opposite to a side on which the principal portion of the first wireless transmission system coil is positioned with respect to the magnetic sheet.

13. The antenna device according to claim 1, further comprising:
a magnetic sheet that is superposed with the second wireless transmission system coil and the first wireless transmission system coil when viewed in plan view; wherein
the power supply coil is disposed in an area outside the second wireless transmission system coil when viewed in plan view; and
in a region that is superposed with the second wireless transmission system coil when viewed in plan view, the magnetic sheet is positioned on a side opposite to a side on which a target coil for the second wireless transmission system is positioned with respect to the second wireless transmission system coil, and in the coupling portion of the first wireless transmission system coil, the magnetic sheet is positioned on a side opposite to a side on which the power supply coil is positioned with respect to the first wireless transmission system coil.

14. The antenna device according to claim 1, wherein a conductive member or a magnetic member is disposed between the power supply coil and the coil for the second wireless transmission system.

15. The antenna device according to claim 1, wherein the first wireless transmission system coil and the second wireless transmission system coil are provided on the same main surface of a substrate.

16. The antenna device according to claim 15, wherein the substrate is bent in the area outside the second wireless transmission system coil, and as a result of the substrate being bent, the coupling portion of the first wireless transmission system coil is positioned on a side opposite to a side on which the surface, on which the second wireless transmission system coil is disposed, is positioned.

17. The antenna device according claim 1, wherein a transmission frequency band of the first wireless transmission system and a transmission frequency band of the second wireless transmission system are different from each other.

18. The antenna device according claim 1, wherein one of the first wireless transmission system and the second wireless transmission system is a near field communication system, and another one of the first wireless transmission system and the second wireless transmission system is a non-contact charging system.

19. The antenna device according to claim 18, wherein the antenna device is included in an electronic device, the electronic device comprising:
a secondary battery that is a power supply for a circuit including a circuit of the near field communication system; and
a non-contact charging control circuit that charges the secondary battery by using electrical power induced by a coil for the non-contact charging system.

* * * * *